United States Patent
Minami et al.

(10) Patent No.: US 10,332,771 B2
(45) Date of Patent: Jun. 25, 2019

(54) JOINED BODY MANUFACTURING METHOD AND JOINED BODY

(71) Applicant: NGK INSULATORS, LTD., Nagoya (JP)

(72) Inventors: Tomoyuki Minami, Handa (JP); Kazuhiro Nobori, Handa (JP); Tetsuya Kawajiri, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 255 days.

(21) Appl. No.: 15/244,397

(22) Filed: Aug. 23, 2016

(65) Prior Publication Data

US 2016/0358801 A1    Dec. 8, 2016

Related U.S. Application Data

(63) Continuation of application No. PCT/JP2015/056525, filed on Mar. 5, 2015.

(30) Foreign Application Priority Data

Mar. 7, 2014   (JP) ................................ 2014-044944

(51) Int. Cl.
*H01L 21/683*   (2006.01)
*H01L 21/67*    (2006.01)
(Continued)

(52) U.S. Cl.
CPC ........ *H01L 21/6831* (2013.01); *C04B 37/025* (2013.01); *C04B 37/026* (2013.01);
(Continued)

(58) Field of Classification Search
CPC .. H01L 21/6831; C04B 37/025; C04B 37/026
See application file for complete search history.

(56) References Cited

U.S. PATENT DOCUMENTS 4,693,409 A * 9/1987 Mizunoya ............... B32B 15/04
                                                      228/122.1
5,561,321 A   10/1996 Hirano et al.
(Continued)

FOREIGN PATENT DOCUMENTS

JP    60-223655 A1   11/1985
JP    06-329481 A1   11/1994
(Continued)

OTHER PUBLICATIONS

English Translation of International Preliminary Report on Patentability, International Application No. PCT/JP2015/056525, dated Sep. 22, 2016 (9 pages).

(Continued)

*Primary Examiner* — Nicholas E Hill
(74) *Attorney, Agent, or Firm* — Burr & Brown, PLLC

(57) ABSTRACT

In a step (a), a ceramic substrate, a brazing material including a metal having a large thermal expansion coefficient, a porous body having a smaller thermal expansion coefficient than the brazing material, and a feeding terminal are placed on a joint surface in such a way that a joint surface of the feeding terminal faces a joint surface of the ceramic substrate. In a step (b), the brazing material is fused to allow the brazing material to penetrate into the pores of the porous body. In this manner, a joint layer containing the brazing material and the porous body is formed, and the joint surface of the ceramic substrate and the joint surface of the feeding terminal are joined to each other through the joint layer.

9 Claims, 5 Drawing Sheets

(51) Int. Cl.
*H01L 21/687* (2006.01)
*C04B 37/02* (2006.01)

(52) U.S. Cl.
CPC .. *H01L 21/67098* (2013.01); *H01L 21/67103* (2013.01); *H01L 21/68757* (2013.01); *H01L 21/68792* (2013.01); *C04B 2237/121* (2013.01); *C04B 2237/343* (2013.01); *C04B 2237/405* (2013.01); *C04B 2237/55* (2013.01); *C04B 2237/597* (2013.01); *C04B 2237/60* (2013.01); *C04B 2237/68* (2013.01); *C04B 2237/704* (2013.01); *C04B 2237/708* (2013.01); *C04B 2237/72* (2013.01); *C04B 2237/86* (2013.01)

(56) References Cited

U.S. PATENT DOCUMENTS

| | | | | |
|---|---|---|---|---|
| 5,675,181 | A | * | 10/1997 | Nishiura ................. H01L 23/15 257/701 |
| 5,986,218 | A | * | 11/1999 | Muto ................... H01L 21/4846 174/250 |
| 2002/0125300 | A1 | | 9/2002 | Ishikawa et al. |
| 2007/0274047 | A1 | | 11/2007 | Nagase et al. |
| 2008/0248326 | A1 | | 10/2008 | Nagase et al. |
| 2009/0243235 | A1 | * | 10/2009 | Nobori ................ H01L 21/6831 279/128 |
| 2010/0230473 | A1 | | 9/2010 | Nagase et al. |

FOREIGN PATENT DOCUMENTS

| | | |
|---|---|---|
| JP | 08-253373 A1 | 10/1996 |
| JP | 3792440 B2 | 7/2006 |
| JP | 2011-091417 A1 | 5/2011 |
| JP | 2012-091975 A1 | 5/2012 |
| JP | 2013-193935 A1 | 9/2013 |

OTHER PUBLICATIONS

International Search Report and Written Opinion (Application No. PCT/JP2015/056525) dated Jun. 2, 2015.

* cited by examiner

JOINED BODY MANUFACTURING METHOD AND JOINED BODY

BACKGROUND OF THE INVENTION

1. Field of the Invention

The present invention relates to a joined body manufacturing method and to a joined body.

2. Description of the Related Art

In one known method for manufacturing a joined body, a ceramic-made member and a metal-made member are joined to each other through a joint layer. For example, PTL 1 describes a method for joining a ceramic member having a recess to a metal member having a protrusion. In the joining method in PTL 1, first, a particulate material is spread over the recess of the ceramic member, and a brazing material is disposed on the particulate material. Then the protrusion of the metal member is inserted into the resulting recess. Next, the brazing material is fused to impregnate the particulate material with the brazing material. A joint layer composed of the brazing material and the particulate material is thereby formed, and the ceramic member and the metal member are joined to each other through the joint layer. This joining method is used, tor example, for a susceptor for semiconductors such as an electrostatic chuck when metallic feeding terminals for energizing electrodes embedded in a ceramic-made substrate are joined to the ceramic-made substrate.

CITATION LIST

Patent Literature

PTL 1: JP 3792440 A

SUMMARY OF THE INVENTION

The joining method described in PTL 1 utilizes the recess of the ceramic member to join the metal member and is therefore not suitable for, for example, joining the metal member to the ceramic member at its flat portion with no recess. Specifically, suppose that the joining method described in PTL 1 is used. In this case, when the particulate material is disposed on a flat ceramic member, the particulate material spreads over the surface of the ceramic member, so that the metal member cannot be joined, appropriately.

The present invention has been made to solve the foregoing problem, and it is a principal object to allow a joined body including a ceramic-made first member and a metal-made second member joined to the first member to be produced irrespective of whether or not the first member has a portion rising from its joint surface.

The joined body manufacturing method of the present invention is a method for manufacturing a joined body in which a joint surface of a first member made of a ceramic and a joint surface of a second member made of a metal axe joined to each other through a joint layer, the method comprising the steps of:

(a) disposing, on the joint surface of the first member, a brazing material including a metal having a larger thermal expansion coefficient than the first member, a porous body having a smaller thermal expansion coefficient than the brazing material, and the second member; and (b) fusing the brazing material to impregnate pores of the porous body with the brazing material to thereby form a joint layer including the brazing material and the porous body, whereby the joint surface of the first member and the joint surface of the second member are joined to each other through the joint layer.

In the joined body manufacturing method of the present invention, when the ceramic-made first member and the metal-made second member are joined to each other, the brazing material, the porous body, and the second member are disposed on the joint surface of the first member. Then the brazing material is fused to impregnate the pores of the porous body with the brazing material. The joint layer including the brazing material and the porous body is thereby formed, and the first member and the second member are joined to each other. As described above, the joint layer is formed using the brazing material and the porous body. Therefore, even when the first member does not have a portion rising from its joint surface (the first member does not have a recess having a bottom serving as the joint surface), the first member and the second member can be joined to each other. Specifically, when a powder, for example, is used instead of the porous body, the powder spreads over when the joint surface of the first member is a flat portion with no recess as described above, but this does not occur when the porous body is used. The use of the porous body allows a joined body in which the first member and the second member are joined to each other to be produced irrespective of whether or not the first member has a portion rising from its joint surface. The joint layer is formed using the brazing material having a larger thermal expansion coefficient than the first member and the porous body having a smaller thermal expansion coefficient than the brazing material. Therefore, the occurrence of cracking in the first member due to a change in the temperature of the joined body can be suppressed more effectively than when, for example, the joint layer is formed using only the brazing material. In step (a), it is preferable that the second member is disposed such that the joint surface of the second member faces the joint surface of the first member. In step (a), it is preferable that the brazing material and the porous body are disposed such that the porous body can be impregnated with the brazing material in step (b). For example, the brazing material and the porous body may be disposed such that they are in contact with each other.

In the joined body manufacturing method of the present invention, the porous body may have a porosity of 30% to 50%. When the porosity of the porous body is equal to or more than the lower limit, a larger amount of the brazing material can penetrate into the porous body, so that joint strength is improved. When the porosity of the porous body is equal to or less than the upper limit, a larger amount of the porous body having a smaller thermal expansion coefficient than the brazing material is present, so that the occurrence of cracking in the first member due to a change in the temperature of the joined body can be suppressed more effectively.

In the joined body manufacturing method of the present invention, the porous body may be a porous sintered body made of the same ceramic material as the first member. In this case, the thermal expansion coefficient of the first member is substantially the same as the thermal expansion coefficient of the porous body, so that the occurrence of cracking in the first member due to a change in the temperature of the joined body can be suppressed more effectively.

In step (a) in the joined body manufacturing method of the present invention, the surface of the pores of the porous body may be coated in advance with a material having higher wettability to the brazing material than the porous body. This allows the brazing material to easily penetrate into the pores of the porous body, so that the joint strength of the joined body can be improved. In this case, the "porosity" of the porous body is its porosity before the coating is formed. In other words, the "porosity" of the porous body is its porosity when the coating is assumed to be absent. More specifically, the "porosity" of the porous body is its porosity when coated portions inside the porous body are considered as pores (empty spaces). When the surface of the pores is coated, it is sufficient that at least part of the surface of open pores be coated.

In step (a) in the joined body manufacturing method of the present invention, the joint surface of the first member may be coated in advance with a material having higher wettability to the brazing material than the joint surface of the first member, and/or the joint surface of the second member may be coated in advance with a material having higher wettability to the brazing material than the joint surface of the second member. When, the material having high wettability to the brazing material is used to coat the at least one of the joint surfaces, the coated joint surface is easily wettable to the brazing material, so that the joint strength of the joined body can be improved. In this case, it is preferable that both the joint surface of the first member and the joint surface of the second member are coated.

In the joined body manufacturing method of the present invention, the first member may not have a portion rising from the joint surface thereof. In other words, the first member may not have a recess having a bottom serving as the joint surface. With the joined body manufacturing method of the present invention, even the first member that does not have a portion rising from its joint surface can be joined to the second member. Therefore, the significance of the application of the present invention is high.

The joined body of the present invention comprises:
a first member including a ceramic;
a second member including a metal; and
a joint layer that joins the first member and the second member to each other, the joint layer including a porous body that has pores filled with a metal having a larger thermal expansion coefficient than the first member, is made of a material having a smaller thermal, expansion coefficient than the metal, and has a porosity of 30% to 50% when the metal is assumed to be absent.

The joined body of the present invention includes the joint layer that includes the porous body and joins the first member and the second member to each other, and the first member and the second member are joined to each other through the joint layer. The pores of the porous body sire filled with a metal, and the porous body is made of a material having a smaller thermal expansion coefficient than the above metal and has a porosity of 30% to 50% when the metal is assumed to be absent. In the joined body, the joint layer includes the porous body and the metal. The joined body provides sufficient joint force between the first member and the second member, irrespective of whether or not, for example, the first member has a portion rising from its joint surface (the first member has a recess having a bottom serving as the joint surface). Since the joint layer for joining includes the metal having a larger thermal expansion coefficient than the first member and the porous body made of the material having a smaller thermal expansion coefficient than the metal, the occurrence of cracking in the first member due to a change in the temperature of the joined body can be suppressed more effectively than with a joint layer composed only of the metal. The joined body of the present invention may be manufactured by, for example, the joined body manufacturing method of the present invention described above. Various modes of the joined body manufacturing method of the present invention described above may be used for the joined body of the present invention. "The porosity when the metal is assumed to be absent" is, in other words, the porosity when portions inside the porous body that are filled with the metal are considered as pores (empty spaces).

DETAILED DESCRIPTION OF THE INVENTION

Figure 1:
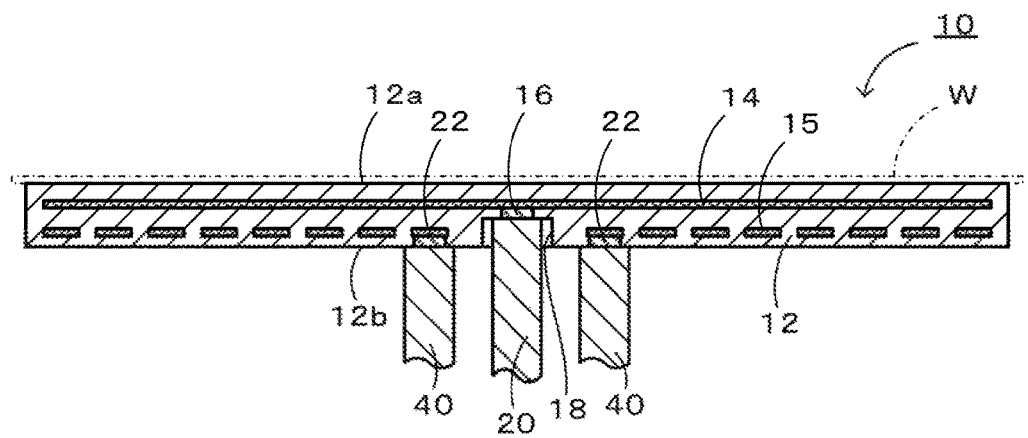
FIG. 1 is a cross-sectional view of an electrostatic chuck 10, the electrostatic chuck 10 being cut along its center axis.
Figure 2:
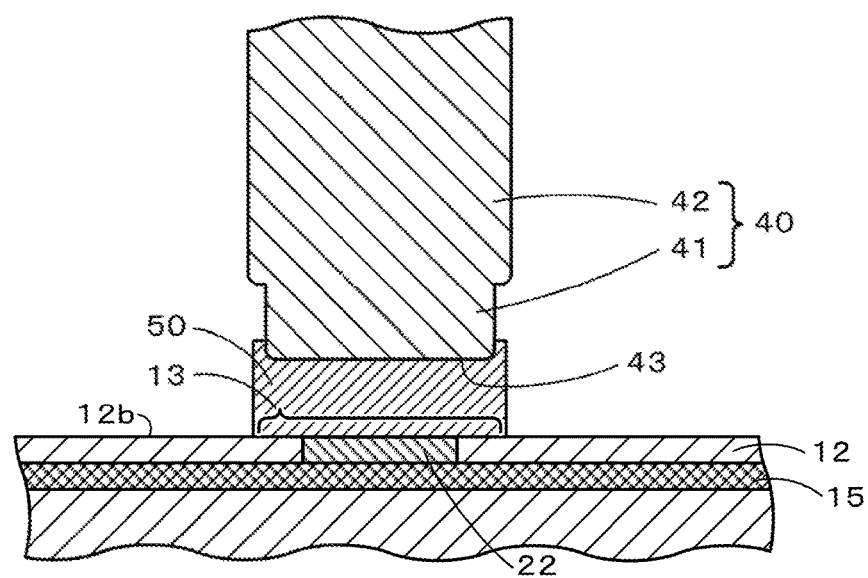
FIG. 2 is an enlarged cross-sectional view of a joint portion between a ceramic substrate 12 and a feeding terminal 40.

Embodiments of the present indention will next be described with reference to the drawings. FIG. 1 is a cross-sectional view of an electrostatic chuck 10, which is one embodiment of the joined body of the present invention, the electrostatic chuck 10 being cut along its center axis. FIG. 2 is an enlarged cross-sectional view of a joint portion between a ceramic substrate 12 and a feeding terminal 40 in FIG. 1. In FIG. 2, the vertical direction in FIG. 1 is reversed.

In the electrostatic chuck 10 in the present embodiment, a wafer-placing surface 12a on which a wafer W can be placed is formed on the ceramic substrate 12, and an electrostatic electrode 14 and a heater electrode 15 are embedded in the ceramic substrate 12 so as to be parallel to the wafer-placing surface 12a.

The ceramic substrate 12 is a disk-shaped member composed mainly of a ceramic material such as alumina or aluminum nitride. No particular limitation is imposed on the thickness of the ceramic substrate 12, and the thickness is, for example, 1 mm to 30 mm. The present invention is particularly effective for a thin structure in which a counterbore cannot be provided.

The electrostatic electrode 14 is a disk-shaped thin-layer electrode having a smaller diameter than the ceramic substrate 12. The electrostatic electrode 14 may be a flat plate or may be a mesh prepared by weaving thin metal wires into a net-like sheet. A conductive tablet 16 is connected to the center of the electrostatic electrode 14. The tablet 16 is exposed at the bottom of a counterbore 18 that is formed so as to extend from a rear surface 12b of the ceramic substrate 12 to the tablet 16. A portion of the ceramic substrate 12 that is located between the electrostatic electrode 14 and the wafer-placing surface 12a functions as a dielectric layer of the electrostatic chuck 10. A feeding terminal 20 is inserted into the counterbore 18. The feeding terminal 20 is joined to the bottom of the counterbore 18 (the upper surface in FIG. 1) and is electrically continuous with the tablet 16. The feeding terminal 20 is a metallic member, and examples of its material include Mo, Ti, and Kovar.

The heater electrode 15 is formed so as to extend from its one end to the other end that are located near the center of the ceramic substrate 12 over the entire ceramic substrate 12 in a unicursal manner. Conductive tablets 22 are connected to one end and the other end of the heater electrode 15. No particular limitation is imposed on the diameter of the tablets 22, and the diameter is, for example, 3 mm or less. Examples of the material, of the tablets 22 include Mo, NbC, WC, Pt, and Nb. The tablets 22 are different from the tablet 16 in that they are not exposed at the bottom surfaces of counterbores (recesses) but are exposed directly at the rear surface 12b of the ceramic substrate 12. Feeding terminals 40 are joined to the rear surface 12b of the ceramic substrate 12, and the feeding terminals 40 are thereby electrically continuous with the tablets 22.

The feeding terminals 40 will be described in detail. Each of the feeding terminals 40 is a substantially cylindrical member and includes a small-diameter portion 41 and a large-diameter portion 42 having a larger diameter than the small-diameter portion 41. No particular limitation is imposed on the outer diameter of the large-diameter portion 42, and the outer diameter is, for example, 3 mm to 12 mm. In each, feeding terminal 40, its end surface on the small-diameter portion 41 side (the lower surface in FIG. 2) is a joint surface 43. The joint surface 43 is joined to a joint surface 13 of the ceramic substrate 12 through a joint layer 50. Each feeding terminal 40 is a metallic member, and examples of the material of the feeding terminal 40 include Mo, Ti, and Kovar. The joint layer 50 will be described later. The joint surface 13 is part of the rear surface 12b of the ceramic substrate 12 and is a substantially circular region in contact with the lower surface of the joint layer 50. The tablets 22 are exposed at the joint surfaces 13 in the rear surface 12b. The tablets 22 are joined to the feeding terminals 40 through the joint layers 50, and the tablets 22 are thereby electrically continuous with the feeding terminals 40.

A method for manufacturing the electrostatic chuck 10 in the present embodiment will next be described below with reference to FIG. 3A to FIG. 3G. First, a thin film 114 is formed on a ceramic sintered body 111a, and the tablet 16 is bonded to the center of the thin film 114. Then a ceramic compact (a compact formed from a ceramic powder) 111b is formed on the thin film 114 to obtain a first intermediate 127 (see FIG. 3A). The thin film 114 is an electrode paste containing the raw material of the electrostatic electrode 14.

Separately from the first intermediate 127, a ceramic sintered body 111c is formed, and closed-bottom holes are formed in the ceramic sintered body 111c at portions corresponding one end and the other end of the heater electrode 15. The tablets 22 coated with an adhesive are fitted into the closed-bottom holes, and then a pattern 115 is produced by screen printing or a doctor blade to prepare a second intermediate 128 (see FIG. 3B). The pattern 115 later becomes the heater electrode 15 and is produced, for example, using the same material as the electrostatic electrode 14.

Figure 3A:
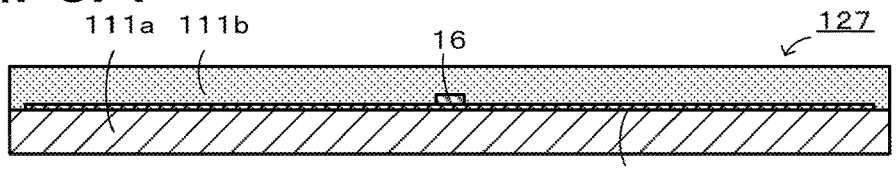
FIG. 3A to FIG. 3G are illustrations of a step of manufacturing the electrostatic chuck 10.
Figure 3B:
Figure 3C:
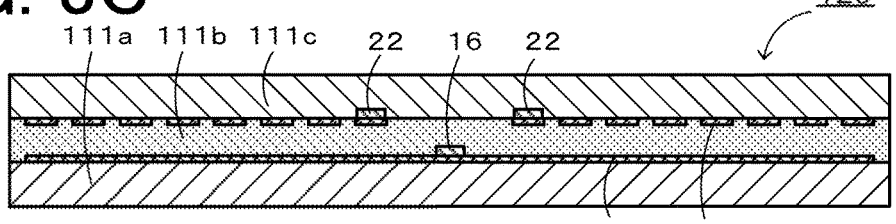
Figure 3D:
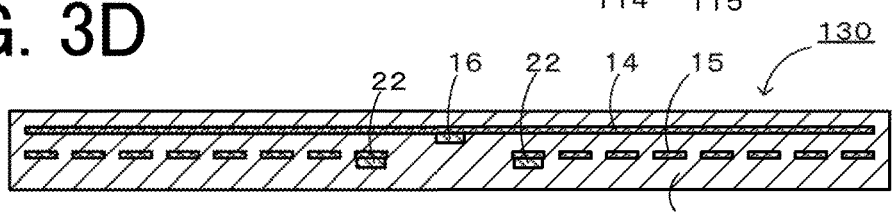

Next, the second intermediate 128 is placed on the ceramic compact 111b of the first intermediate 127 such that the pattern 115 is in contact with the ceramic compact 111b, and the intermediates are integrated by uniaxial press molding to thereby obtain a laminate 129 (see FIG. 3C). Then the laminate 129 is subjected to hot-press firing to obtain an electrode-embedded sintered body 130 (see FIG. 3D). In this manner, the ceramic sintered body 111a, the ceramic compact 111b, and the ceramic sintered body 111c form one sintered body (the ceramic substrate 12). The thin film 114 serves as the electrostatic electrode 14, and the pattern 115 serves as the heater electrode 15.

Figure 3E:
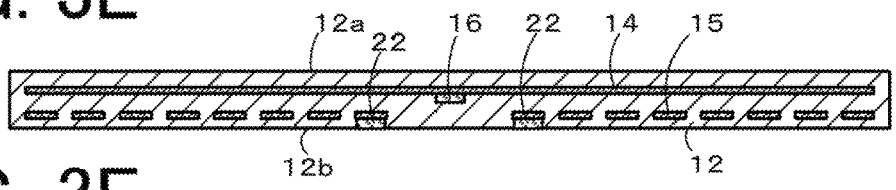

Next, the rear surface side of the electrode-embedded sintered body 130 (the lower side in FIG. 3D) is ground so that the surfaces of the tablets 22 are exposed at the rear surface 12b (see FIG. 3E). Preferably, the front surface side of the electrode-embedded sintered body 130 (the upper side in FIG. 3D) is also ground such that the wafer-placing surface 12a has a surface roughness Ra of 0.01 to 3 μm and a flatness of 0 to 10 μm and that the distance from the upper surface of the electrostatic electrode 14 to the wafer-placing surface 12a is 0.2 to 1 mm.

Figure 3F:
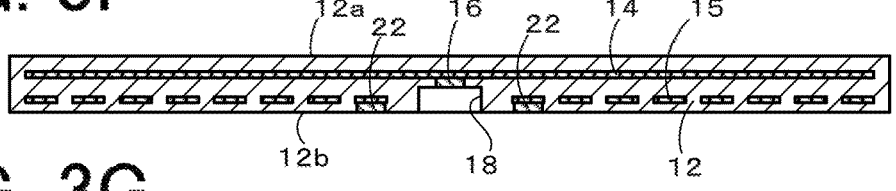
Figure 3G:
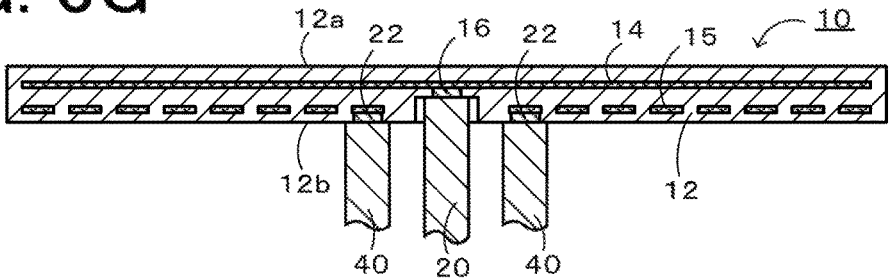
Figure 4:
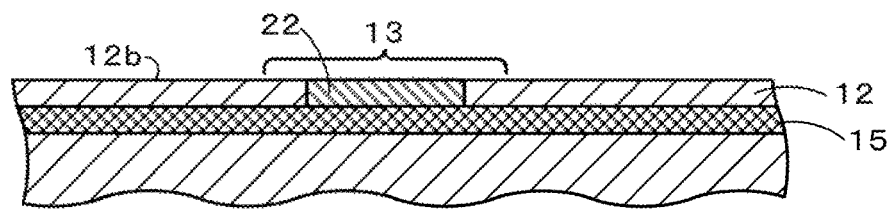
FIG. 4 is an illustration of a step of joining each feeding terminal 40 to a ceramic substrate 12.

Then the counterbore 18 is formed at the center of the rear surface 12b of the electrode-embedded, sintered body 130 to expose the tablet 16 (see FIG. 3F). Then the feeding terminal 20 is inserted into the counterbore 18 and joined to the bottom of the counterbore 18 to establish electrical continuity between the tablet 16 and the feeding terminal 20. The feeding terminals 40 are joined to the rear surface 12b of the ceramic substrate 12, so that the tablets 22 are electrically continuous with the feeding terminals 40. The electrostatic chuck 10 is thereby completed (see FIG. 3G).

The method for manufacturing the electrostatic chuck 10 that is a joined body obtained by joining the feeding terminals 40 to the ceramic substrate 12 will be described in detail. FIGS. 4 to 7 are illustrations of the step of joining each feeding terminal 40 to the ceramic substrate 12.

Figure 5:
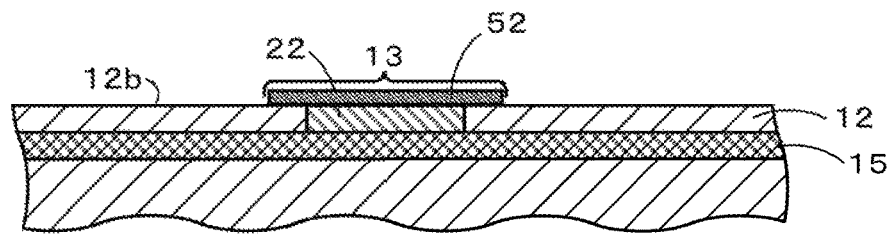
FIG. 5 is an illustration of a step of joining each feeding terminal 40 to a ceramic substrate 12.

First, a prescribed area, which is part of the rear surface 12b of the ceramic substrate 12, is defined as a joint surface 13 (see FIG. 4), and the joint surface 13 is coated with a substrate-coating layer 52 (see FIG. 5). The joint surface 13 is defined such that a tablet 22 is exposed at the center of the joint surface 13. The wettability of the substrate-coating layer 52 to a brazing material 56 described later is higher than the wettability of the ceramic substrate 12 to the brazing material 56. Examples of the material of such a substrate-coating layer 52 include Ni and Au. No particular limitation is imposed on the thickness of the substrate-coating layer 52, and the thickness is, for example, 1 to 6 μm. The substrate-coating layer 52 is formed by, for example, electroless plating or sputtering with the rear surface 12b except for the joint surface 13 masked.

Figure 6:
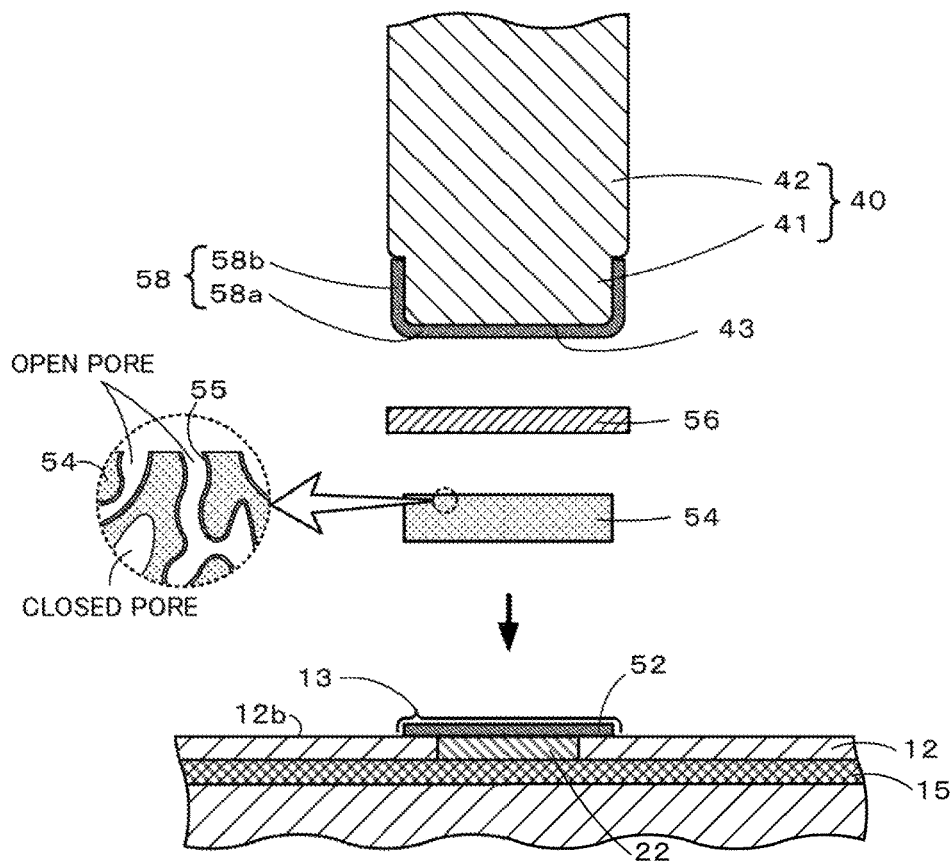
FIG. 6 is an illustration of a step of joining each; feeding terminal 40 to a ceramic substrate 12.

Next, a porous body 54, the brazing material 56, and the feeding terminal 40 are prepared, and is performed, as step (a), i.e., these are placed in the above order on the joint surface 13 (on the substrate-coating layer 52) (see FIG. 6). The porous body 54 is made of a material having a smaller thermal expansion coefficient than the brazing material 56. The porous body 54 is a sintered body of a ceramic such as alumina or aluminum nitride. The porous body 54 is prepared by firing a compact of ceramic particles having an average diameter of, for example, 10 μm to 500 μm and preferably 20 μm to 100 μm. Preferably, the porous body 54 is a sintered body formed of the same ceramic material as the ceramic substrate 12. The porous body 54 has a porosity of preferably 30% to 50%. Preferably, the dry air permeability of the porous body 54 is 50 mL/cm²·min) to 150 mL/(cm²·min). The porosity of the porous body 54 is a value measured by the Archimedes method. The dry air permeability is a value measured based on. JIS-Z8762 (1988) and JIS-B8330 (1981). Specifically, in an indoor room with the room temperature controlled (at 20° C.±3° C.), an orifice plate and an air tank are disposed in an air passage extending from a blower for sending air to the porous body 54. When the air sent from the blower causes a prescribed air pressure to be applied to the air tank, the difference in pressure across the orifice plate is measured, and a value obtained by converting the measured difference in pressure to air permeability is used as the dry air permeability. In the porous body 54, the surface of the inner pores is coated with a pore-coating layer 55 (see an enlarged view in FIG. 6). Among the surfaces of the pores of the porous body 54, at least part of the surfaces of open pores are coated with the pore-coating layer 55. It is unnecessary to coat the surfaces of closed pores with the pore-coating layer 55. The exterior surface of the porous body 54 (the upper, lower, and side surfaces of the porous body 54 other than the surfaces of the pores) may be coated with the pore-coating layer 55. The "porosity" and "dry air permeability" of the porous body 54 described above are values before the formation of the pore-coating layer 55. In other words, the "porosity" of the porous body 54 is its porosity when the pore-coating layer 55 is assumed to be absent. More specifically, the "porosity" of the porous body 54 is its porosity when portions inside the porous body 54 that are coated with the pore-coating layer 55 are considered as pores (empty spaces). The wettability of the pore-coating layer 55 to the brazing material 56 is higher than the wettability of the porous body 54 to the brazing material 56. Examples of the material of such a pore-coating layer 55 include Ni and Au. No particular limitation is imposed on the thickness of the pore-coating layer 55, and the thickness is, for example, 1 μm to 6 μm and may be 1 μm to 3 μm. The thickness of the pore-coating layer 55 is a value measured by observing its cross section under an electron microscope (SEM). The pore-coating layer 55 may be formed by, for example, electroless plating. When the amount of the pore-coating layer 55 formed on the surface of the pores inside the porous body 54 (the area of the coated surface of the pores) is increased, the brazing material 56 can easily penetrate into the pores of the porous body 54. As the amount of the brazing material 56 penetrating into the pores of the porous body 54 increases, the conductivity of the joint layer 50 after joining can be increased.

The brazing material 56 is formed of a metal having a larger thermal expansion coefficient than the ceramic substrate 12 and composed mainly of, for example, aluminum. In the present embodiment, the brazing material 56 has a plate (disk) shape. As shown in FIG. 6, the diameter (the lateral length in FIG. 6) of the brazing material 56 may be larger than the diameter of the porous body 54 and the diameter of the joint surface 43 (for example, the difference in diameter is 1 mm). The feeding terminal 40 has the above-described shape. In the feeding terminal 40, its end portion on the joint surface 43 side (the lower end portion in FIG. 6) is coated with a terminal-coating layer 38 in advance. The terminal-coating layer 58 is formed into a closed-end tubular shape and includes a bottom coating layer 58a and a side coating layer 58b. The bottom coating layer 58a covers the joint surface 43, which is the bottom surface of the small-diameter portion 41 of the feeding terminal 40. The side coating layer 58b covers the side surface of the feeding terminal 40 (the outer circumferential surface of the small-diameter portion 41). The bottom coating layer 58a and the side coating layer 58b are continuous to each other at the corner between the joint surface 43 and side surface of the feeding terminal 40 and are formed integrally. The wettability of the terminal-coating layer 58 to the brazing material 56 is higher than the wettability of the feeding terminal 40 to the brazing material 56. Examples of the material of such a terminal-coating layer 58 include Ni and Au. No particular limitation is imposed on the thickness of the terminal-coating layer 58, and the thickness is, for example, 1 to 6 μm. The terminal-coating layer 58 is formed by, for example, electroless plating, electroplating, or sputtering after a portion of the feeding terminal 40 not to be coated with the side coating layer 58b, such as the outer circumferential surface of the large-diameter portion 42, is masked.

Figure 7:
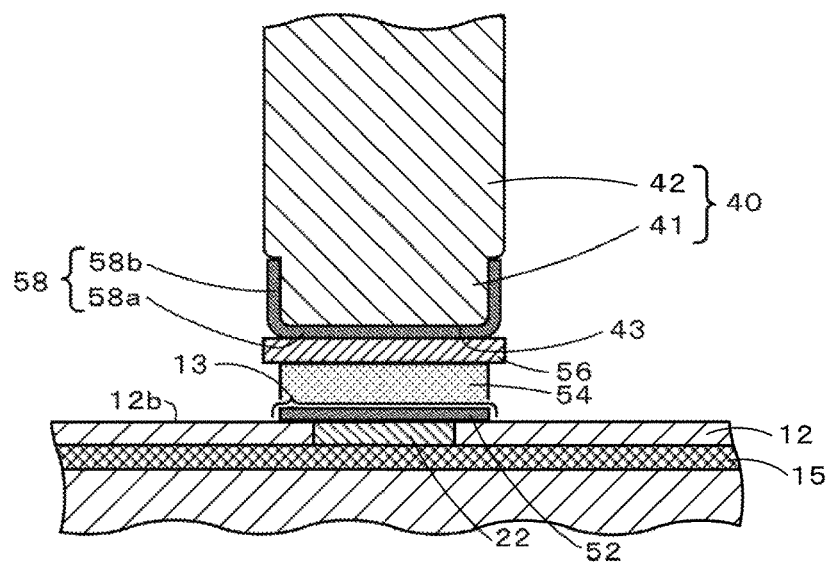
FIG. 7 is an illustration of a step of joining each feeding terminal 40 to a ceramic substrate 12.

After completion of the placement of the porous body 54, the brazing material 56, and the feeding terminal 40 on the joint surface 13, the joint surface 13 of the ceramic substrate 12 faces the joint surface 43 of the feeding terminal 40 (see FIG. 7). In the state in FIG. 7, the porous body 54 is in contact with the substrate-coating layer 52 and with the brazing material 56. The terminal-coating layer 58 is in contact with the brazing material 56.

After step (a) is performed as described above, step (b) is performed. In step (b), the brazing material 56 is fused to allow the brazing material 56 to penetrate into the pores (open pores) of the porous body 54. In this manner, a joint layer 50 containing the brazing material 56 and the porous body 54 is formed, and the joint surface 13 of the ceramic substrate 12 and the joint surface 43 of the feeding terminal 40 are joined to each other through the joint layer 50. The electrical continuity between the feeding terminal 40 (the joint surface 43) and the tablet 22 is established, through the brazing material 56 penetrating into the open, pores of the porous body 54 in the joint layer 50 and through the brazing material 56 adhering to the exterior surface of the porous body 54 (the upper, lower, and side surfaces of the porous body 54 other than the surfaces of the pores). The substrate-coating layer 52, the pore-coating layer 55, and the terminal-coating layer 58 may also be fused and mixed with the brazing material 56 and form part of the joint layer 50. A joined body (the electrostatic chuck 10) in which the feeding terminals 40 are joined to the ceramic substrate 12 is thereby manufactured (see FIG. 2). In each porous body 54 included in the thus-manufactured joint layer 50, the pores are filled with the metal such as the brazing material 56. The porosity of the porous body 54 when the filling metal is assumed to be absent (this porosity may be referred to also as virtual porosity) is preferably 30% to 50%. The virtual porosity of the joint layer 50 (the porous body 54) can be determined as follows. An image of a cross section of the joint layer 50 is taken using an electron microscope (SEM), and the cross-sectional image is subjected to image processing. Specifically, data such as brightness of each of pixels in the cross-sectional image is compared with a prescribed threshold vale to binarize the data, and the pixels are classified into pixels of the porous body 54 and pixels of portions other than the porous body 54 (e.g., metal portions filling the pores of the porous body 54). The ratio of the number of pixels of the portions other than the porous body 54 to the total number of pixels in the cross-sectional image is used as the virtual porosity. The virtual porosity is substantially the same as the above-described "porosity" of the porous body 54 (its porosity before the porous body 54 is coated with the pore-coating layer 55).

The brazing material 56 is fused in step (b), for example, at a temperature higher by 10° C. to 150° C. than the melting point of the brazing material 56 and preferably at a temperature higher by 100° C. to 150° C. than the melting point.

The holding time at this temperature is, for example, 5 minutes to 90 minutes and preferably 10 minutes to 30 minutes. The atmosphere during joining is, for example, an atmosphere with a high degree of vacuum of preferably $1\times10^{-4}$ Torr or lower and more preferably $2\times10^{-5}$ Torr or lower. The feeding terminals 40 may be joined to the ceramic substrate 12 while pressed against the ceramic substrate 12.

The feeding terminal 20 and the bottom of the counterbore 18 may be joined to each other (see FIG. 1) in the same manner as in steps (a) and (b) above. Specifically, a porous body 54, the brazing material 56, and the feeding terminal 20 are inserted into the counterbore 18. Alternatively, the feeding terminal 20 and the bottom of the counterbore 18 may be joined to each other as follows. Instead of the porous body 54, a powder composed of the same material as the porous body 54 is spread over the bottom surface of the counterbore 18, and then the brazing material 56 and the feeding terminal 20 are inserted into the counterbore 18. Then the brazing material 56 is fused in the same manner as in step (b) descried above.

An example of the use of the electrostatic chuck 10 in the present embodiment will next be briefly described. A wafer W is placed on the wafer-placing surface 12a of the electrostatic chuck 10, and high DC voltage is applied to the electrostatic electrode 14 through the feeding terminal 20 of the electrostatic electrode 14 to generate electrostatic force, whereby the wafer w is attracted to the wafer-placing surface 12a. A heater power source is connected to the two feeding terminals 40, 40 of the heater electrode 15, and the supplied electric power is controlled to adjust the temperature of the wafer W to a desired temperature. In this state, the wafer W is subjected to plasma CVD to form a film or subjected to plasma etching. Specifically, in an unillustrated vacuum chamber, high-frequency voltage is applied to the electrostatic electrode 14 through the feeding terminal 20 to generate a plasma between parallel flat electrodes including the electrostatic electrode 14 embedded in the electrostatic chuck 10 and an unillustrated horizontal counter electrode disposed in an upper portion of the vacuum chamber, and the generated plasma is used to subject the wafer W to CVD to form a film or etching.

Next, the correspondences between the components in the present embodiment and the components in the present invention will be clarified. The ceramic substrate 12 in the present embodiment corresponds to the first member in the present invention, and each of the feeding terminals 40 corresponds to the second member in the present invention. The brazing material 56 corresponds to the brazing material in the present invention, and each of the porous bodies 54 corresponds to the porous body in the present invention. Each of the joint layers 50 corresponds to the joint layer in the present invention.

In the above-described method for manufacturing the electrostatic chuck 10 in the present embodiment, when the metallic feeding terminals 40 are joined to the ceramic substrate 12, the brazing material 56, the porous bodies 54, and the feeding terminals 40 are placed on the joint surfaces 13 of the ceramic substrate 12 in step (a). Then the brazing material 56 is fused to allow it to penetrate into the pores of each porous body 54, and a joint layer 50 including the brazing material 56 and the porous body 54 is thereby formed, whereby each feeding terminal 40 is joined to the ceramic substrate 12. As described above, the joint layer 50 is formed using the brazing material 56 and the porous body 54. Therefore, even when the ceramic substrate 12 does not have portions rising from the joint surfaces 13 (the ceramic substrate 12 does not have recesses having bottoms serving as the joint surfaces 13), the feeding terminals 40 can be joined to the ceramic substrate 12. For example, when, instead of each porous body 54, a powder composed of the same material as the porous body 54 is used, the powder spreads over if the joint surface 13 is a flat port ion of the ceramic substrate 12 with no recess, but this does not occur when the porous body 54 is used. The joint layer 50 is formed using the brazing material 56 having a larger thermal expansion coefficient than the first member and the porous body 54 made of the material having a smaller thermal expansion coefficient than the brazing material 56. Therefore, the occurrence of cracking in the ceramic substrate 12 due to a change in the temperature of the electrostatic chuck 10 can be suppressed more effectively than when, for example, the joint layer 50 is formed using only the brazing material 56.

When the porosity of the porous body 54 is 30% to 50%, the following effects are obtained. Specifically, when the porosity of the porous body 54 is equal to or more than the lower limit, a larger amount of the brazing material 56 can penetrate into the porous body 34, so that the joint strength is improved. When the porosity of the porous body 54 is equal to or less than the upper limit, a larger amount of the porous body 54 having a smaller thermal expansion coefficient than the brazing material 56 is present, so that the occurrence of cracking in the ceramic substrate 12 due to a change in the temperature of the electrostatic chuck 10 can be suppressed more effectively.

When the porous body 54 is a porous sintered body made of the same ceramic material as the ceramic substrate 12, the thermal expansion coefficient of the ceramic substrate 12 is substantially the same as the thermal expansion coefficient of the porous body 54, so that the occurrence of cracking in the ceramic substrate 12 due to a change in the temperature of the electrostatic chuck 10 can be suppressed more effectively.

In step (a), the surface of the pores inside the porous body 54 is coated in advance with the pore-coating layer 55 made of a material having higher wettability to the brazing material 56 than the porous body 54. This allows the brazing material 56 to easily penetrate into the pores of the porous body 54, so that the joint strength of the electrostatic chuck 10 can be improved.

Moreover, each joint surface 13 of the ceramic substrate 12 is coated with the substrate-coating layer 52 which is made of a material having higher wettability to the brazing material 56 than the joint surface 13, and the joint surface 43 of each feeding terminal 40 is coated with the terminal-coating layer 58 which is made of a material having higher wettability to the brazing material 56 than the joint surface 43. Therefore, the coated joint surfaces 13 and the coated joint surfaces 43 are easily wettable to the brazing material 56, so that the joint strength of the electrostatic chuck 10 can be improved.

Since the ceramic substrate 12 does not have portions rising from the joint surfaces 13, the significance of the application of the present invention is high. For example, if the tablets 22 are exposed at the bottoms of counterbores (recesses) formed on the rear surface 12b, an additional thickness corresponding to the height of the counterbores is required for the ceramic substrate 12, so that the thickness of the ceramic substrate 12 cannot be easily reduced. For susceptors for semiconductors such as the electrostatic chuck 10, there is a need for relatively thin ceramic substrates 12 having a thickness of, for example, 1 mm. Even in this case, the application of the present invention allows the feeding terminals 40 to be joined to the ceramic substrate 12 even though the joint surfaces 13 are not the bottoms of counterbores. Therefore, the ceramic substrate 12 can be easily reduced in thickness.

The present invention is not limited the embodiment described above. It will be appreciated that the present invention can be implemented in various forms so long as they fall within the technical scope of the invention.

In the embodiment described above, the substrate-coating layer 52, the pore-coating layer 55, and the terminal-coating layer 58 are formed. However, for example, at least one of them may be omitted. When at least one of the joint surface 13, the joint surface 43, and the porous body 54 has relatively high wettability to the brazing material 56, the joint force between the ceramic substrate 12 and the feeding terminals 40 through the joint layers 50 is sufficient even when the coating layer for the high wettability portion is omitted. Only the bottom coating layer 58a in the terminal-coating layer 58 may be formed, and the side coating layer 58b may be omitted.

In the above-described embodiment, each feeding terminal 40 includes the small-diameter portion 41 and the large-diameter portion 42, but this is not a limitation. For example, the feeding terminal 40 may be a cylindrical member with a constant diameter over the entire portion from the upper end to the lower end. Specifically, in the feeding terminal 40, the small-diameter portion 41 and the large-diameter portion 42 have the same diameter.

Figure 8:
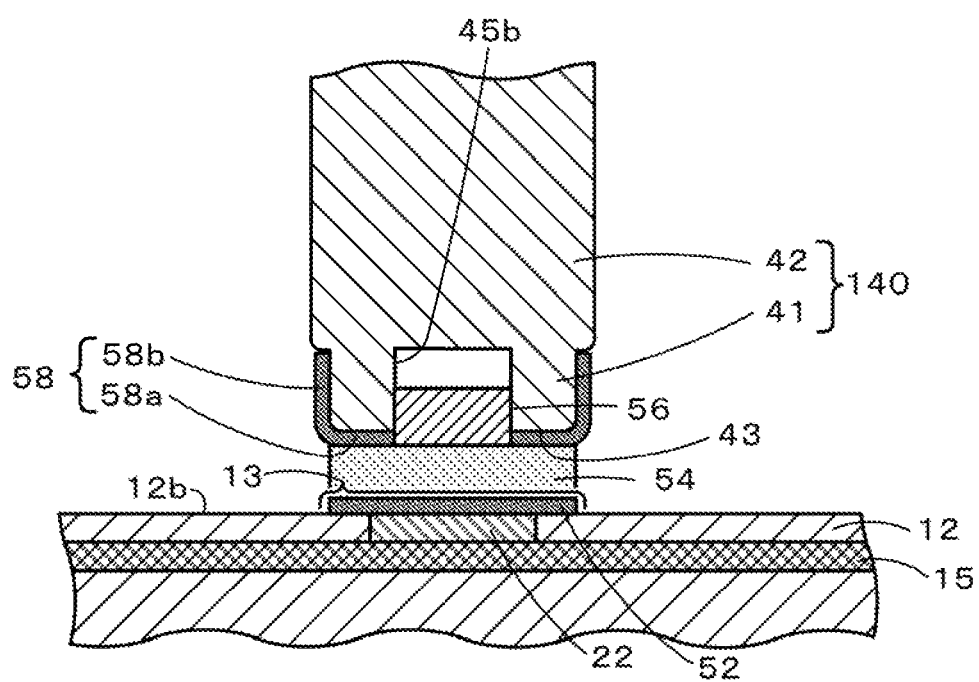
FIG. 8 is an enlarged cross-sectional view of a joint portion between a ceramic substrate 12 and a feeding terminal 140 in a modification.

In the above-described embodiment, the porous body 54 and the brazing material 56 are disposed in step (a) such that they are interposed between the joint surface 13 and the joint surface 43, but this is not a limitation, for example, the porous body 54 and the brazing material 56 may be disposed such that the brazing material 56 is inserted into an insertion hole formed in the feeding terminal 40. FIG. 8 is an enlarged cross-sectional view of a joint portion between the ceramic substrate 12 and a feeding terminal 140 in a modification. This feeding terminal 140 is different from the feeding terminal 40 and has an insertion hole 45b formed in the small-diameter portion 41. The insertion hole 45b has an opening on the surface on the joint surface 43 side (the lower surface in FIG. 8). Therefore, in the feeding terminal 140, the joint surface 43 has a ring shape. When the above-described feeding terminal 140 is joined to the joint surface 13, the brazing material 56 is inserted into the insertion hole 45b of the feeding terminal 140 in step (a) as shown in FIG. 8, and the feeding terminal 140 (and the brazing material 56) is placed on the porous body 54. Then the brazing material 56 is fused in step (b) to form a joint layer 50 including the porous body 54 and the brazing material 56 in the same manner as in the above-described embodiment, whereby the feeding terminal 140 can be joined to the ceramic substrate 12.

In the above-described embodiment, the feeding terminal 20 is joined to the bottom of the counterbore 18 in the ceramic substrate 12, but this is not a limitation. For example, the counterbore 18 may not be formed, and the surface of the tablet 16 may be exposed at the rear surface 12b of the ceramic substrate 12. In this case, as in the feeding terminals 40 joined to the ceramic substrate 12 in the above-described embodiment, the feeding terminal 20 may be joined through a joint layer 50 to the rear surface 12b including the exposed surface of the tablet 16.

EXAMPLES

Example 1

In Example 1, a joined body including the ceramic substrate 12 and the feeding terminals 40 was produced in the same manner as in the manufacturing method described using FIGS. 4 to 7 above. Specifically, first, alumina powder with a purity of 99.5% was fired such that the density after firing was 99.5% or more. The fired product was ground to produce a disk-shaped alumina sintered body having an outer diameter of 300 mm and a thickness of 5 mm and used as the ceramic substrate 12. In Example 1, Mo-made tablets 22 were embedded in the alumina powder in advance, and the fired ceramic substrate 12 was ground until the surfaces of the tablets 22 were exposed. 4 mm-diameter regions of the ceramic substrate 12 (including 2.0 mm-diameter regions, i.e., the surfaces of the tablets 22) were used as the joint surfaces 13. A region other than the joint surfaces 13 was masked, and electroless Ni plating with a purity of 99% and a thickness of about 1 µm was formed to obtain substrate-coating layers 52 covering the joint surfaces 13 and having a diameter of 4 mm.

Next, the brazing material 56, the feeding terminals 40, and the porous bodies 54 (made of alumina, porosity: 38%, dry air permeability: 110 mL/(cm²·min)) having the following properties were prepared. Each porous body 54 had a disk shape with dimensions of a diameter of 4 mm and a thickness of 0.3 mm. In the porous body 54, the pore-coating layer 55 made of electroless Ni plating having a thickness of 1 to 2 µm was formed on the surface of open pores in advance. The pore-coating layer 55 was formed as follows. First, the following treatment was performed as pretreatment (nucleation treatment). The porous body 54 was impregnated with a tin chloride solution, and this state was maintained for 3 minutes. Then the tin chloride solution was sucked. The resulting porous body 54 was washed with pure water, and nitrogen was blown to remove water. Next, the porous body 54 was impregnated with a Pt solution, and this state was maintained for 2 minutes. Then the Pt solution was sucked. The resulting porous body 54 was washed with pure water, and nitrogen was blown to remove water. This pretreatment was repeated a total of two times. Next, the following treatment was performed as plating treatment. The porous body 54 was placed on a hot plate, and its surface temperature was adjusted to 80 to 85° C. Then the porous body 54 was impregnated with an electroless Ni plating solution. The electroless Ni plating solution was appropriately changed and then discharged, and the porous body 54 was washed with pure water and dried. As a result of the above treatment, the pore-coating layer 55 was formed.

The brazing material 56 was an Al—Si—Mg-based alloy (JIS BA 4004) and had a disk shape with a diameter of 5 mm and a thickness of 0.12 mm. The feeding terminals 40 were made of Mo. The outer diameter of the small-diameter portion 41 was 4 mm, and the axial length of the small-diameter portion 41 was 1 mm. The outer diameter of the large-diameter portion 42 was 5 mm, and the axial length of the large-diameter portion 42 was 5 mm. In each of the feeding terminals 40, the terminal-coating layer 58 including the bottom coating layer 58a and the side coating layer 58b was formed in the small-diameter portion 41. The terminal-coating layer 58 was formed as follows. First, each feeding terminal 40 was ultrasonically cleaned in acetone for 5 minutes and then in pure water for 10 minutes, and nitrogen was blown at 120° C. for 10 minutes to remove water on the surface to thereby dry the surface. Next, the terminal-coating layer 58 formed of electroless Ni plating with a thickness of 1 µm was formed. The side coating layer 58b was formed so as to cover the entire side surface of the small-diameter portion 41.

In step (a), the porous bodies 54, the brazing material 56, and the feeding terminals 40 described above were placed in this order on the joint surfaces 13 (the substrate-coating layers 52).

In step (b), the ceramic substrate 12, the feeding terminals 40, the brazing material 56, and the porous bodies 54 that were placed in step (a) were placed in a firing furnace and heated to form joint layers 50, whereby the feeding terminals 40 were joined to the ceramic substrate 12. The heating conditions were a temperature of 700° C.±20° C., a holding time of 10 minutes, and a degree of vacuum of $5\times10^{-5}$ Torr or lower. In the firing furnace, each, feeding terminal 40 was pressed, against the ceramic substrate 12 using a weight of 125 gf. After the joining in step (b), the joined body was removed from the firing furnace. The joined body in Example 1 was produced in the manner described above. The virtual porosity of the joint, layers 50 (the porous bodies 54) of the joined body was 43%. To compute the virtual porosity, an SEM image of a cross section of a joint layer 50 was obtained using a scanning electron microscope (JSM-5900, JEOL Ltd.), and the obtained SEM image was binarized based on the brightness of each pixel using image processing software HALCON 11.0 (HALCON is a registered trademark of MVTec Software GmbH).

Comparative Example 1

A joined body in Comparative Example 1 was produced in the same manner as in Example 1 except that the feeding terminals 40 were joined to the ceramic substrate 12 through the brazing material 56 without using the porous bodies 54.

The joint strength of the joined body in Example 1 was measured by applying force so as to separate the ceramic substrate 12 and the feeding terminals 40 from each other in the direction of the force. The joint strength was 40 kgf, and this is a practically acceptable value for the electrostatic chuck 10. The joint strength was measured using a tensile strength tester (Autograph, manufactured by Shimadzu Corporation).

The joined bodies in Example 1 and Comparative Example 1 were heated using an external heater from room temperature to 100° C. at a rate of 5° C./second and then allowed to naturally cool to room temperature. This process was repeated 1,000 times. Then, for each of the joined bodies, the presence or absence of cracking was checked. No cracking was found in the joined body in Example 1, but cracking was found, in the ceramic substrate 12 in the joined body in Comparative Example 1.

Comparative Example 2

An attempt was made to produce a joined body in the same manner as in Example 1 except that a powder composed of ceramic particles made of the same material as the porous bodies 54 was used instead of the porous bodies 54. However, the powder spread over the surface of the ceramic substrate 12, and the feeding terminals 40 were not joined to the ceramic substrate 12 even after heating in the firing furnace.

Examples 2 to 11

Joined bodies in Examples 2 to 11 were produced in the same manner as in Example 1 except that porous bodies 54 having porosities shown in Table 1 were used. For each of Examples 2 to 11, the rupture strength (joint strength) of the as-produced joined body and the presence or absence of cracking in the as-produced joined body were measured as initial properties. The rupture strength of the joined body and the presence or absence of cracking were measured also after a thermal cycle test. The thermal cycle test was performed as follows. The joined bodies in Examples 2 to 11 were heated using an external heater from room temperature to 100° C. at a rate of 5° C./second and then allowed to naturally cool to room temperature. This process was repeated 1,000 times. A plurality of joined bodies were produced for each of the Examples, and the measurement of the initial properties and the measurement after the thermal cycle test were performed using different joined bodies.

The porosity of the porous bodies 54 used in Examples 2 to 11, the rupture strength of the as-produced joined bodies, the presence or absence of cracking in the as-produced joined bodies, the rupture strength after the thermal cycle test, and the presence or absence of cracking after the thermal cycle test are summarized in Table 1. The meaning of the indices for cracking in Table 1 is as follows. A: No cracking was found. B: Cracking was found, but the degree of cracking was small, and the cracking had no influence on the joining properties. C: Cracking having an influence on the joining properties was found.

TABLE 1

| | Porosity of Porous Body [%] | Initial Property | | After Thermal Cycle Test | |
|---|---|---|---|---|---|
| | | Strength [kgf] | Cracking | Strength [kgf] | Cracking |
| Example 2 | 21 | 21 | A | 23 | A |
| Example 3 | 25 | 24 | A | 25 | A |
| Example 4 | 30 | 34 | A | 37 | A |
| Example 5 | 34 | 35 | A | 39 | A |
| Example 6 | 38 | 38 | A | 42 | A |
| Example 7 | 41 | 40 | A | 44 | A |
| Example 8 | 46 | 46 | A | 45 | A |
| Example 9 | 50 | 53 | A | 50 | A |
| Example 10 | 54 | 65 | A | 31 | C |
| Example 11 | 61 | 51 | B | 26 | C |

As is clear from Table 1, in Examples 4 to 9 in which the porosity of the porous bodies 54 used was 30% to 50%, the initial rupture strength and the rupture strength after the thermal cycles were higher than those in Examples 2 and 3 in which the porosity was lower than 30%. In Examples 4 to 9, the initial rupture strength and also the rupture strength after the thermal cycles were 30 kgf or more and were sufficiently acceptable for use as the electrostatic chuck 10. In Examples 10 and 11 in which the porosity was more than 50%, the initial joint strength was 30 kgf or more. Although cracking that could influence the joining properties did not occur, cracking occurred in the ceramic substrate 12 after the thermal cycle test. In Examples 4 to 9, no cracking occurred at the beginning and also after the thermal cycles. In Examples 4 to 9, since the porosity of the porous bodies 54 is 30% or more, a large amount of the brazing material 56 can penetrate into the porous bodies 54. This may be the reason for the improvement in joint strength. When the porosity of the porous bodies 54 is 50% or less, a larger amount of the porous bodies 54 having a smaller thermal expansion coefficient than the brazing material 56 is present, and this may suppress the occurrence of cracking due to a change in the temperature of the joined body more effectively.

The present invention is not limited to the above-described Examples 1 to 11.

The present application claims priority from Japanese Patent Application No. 2014-044944 filed on Mar. 7, 2014, the entire contents of which are incorporated herein by reference.

What is claimed is:

1. A joined body comprising:
    a first member including a ceramic;
    an electrode embedded in the first member;
    a second member including a metal; and
    a joint layer that joins the first member and the second member to each other such that the second member is electrically continuous with the electrode, the joint layer including a porous body that has pores filled with a metal having a larger thermal expansion coefficient than the first member, is made of a material having a smaller thermal expansion coefficient than the metal, and has a porosity of 30% to 50% when the metal is assumed to be absent.

2. The joined body according to claim 1, wherein the first member and the porous body are members that are different from each other.

3. The joined body according to claim 2, wherein the first member is a ceramic substrate in an electrostatic chuck and the second member is a feeding terminal in the electrostatic chuck.

4. A method for manufacturing the joined body according to claim 1 in which a joint surface of a first member made of a ceramic and a joint surface of a second member made of a metal are joined to each other through a joint layer, the method comprising the steps of:
    (a) disposing, on the joint surface of the first member, a brazing material including a metal having a larger thermal expansion coefficient than the first member, a porous body having a smaller thermal expansion coefficient than the brazing material, and the second member; and
    (b) fusing the brazing material to impregnate pores of the porous body with the brazing material to thereby form a joint layer including the brazing material and the porous body, whereby the joint surface of the first member and the joint surface of the second member are joined to each other through the joint layer.

5. The method for manufacturing a joined body according to claim 4, wherein the porous body has a porosity of 30% to 50%.

6. The method for manufacturing a joined body according to claim 4, wherein the porous body is a porous sintered body made of the same ceramic material as the first member.

7. The method for manufacturing a joined body according to claim 4, wherein in the step (a), the surface of the pores of the porous body is coated in advance with a material having higher wettability to the brazing material than the porous body.

8. The method for manufacturing a joined body according to claim 4, wherein in the step (a), the joint surface of the first member is coated in advance with a material having higher wettability to the brazing material than the joint surface of the first member, and/or the joint surface of the second member is coated in advance with a material having higher wettability to the brazing material than the joint surface of the second member.

9. The method for manufacturing a joined body according to claim 4, wherein the first member does not have a portion rising from the joint surface thereof.

* * * * *